Inventor
Vincent P. Romeo
By his Attorney
Richard A. Wise

Feb. 25, 1969 V. P. ROMEO 3,429,170

COMPONENT INSERTERS

Filed June 17, 1966

Sheet 4 of 4

United States Patent Office 3,429,170

Patented Feb. 25, 1969

3,429,170

COMPONENT INSERTERS

Vincent P. Romeo, Danvers, Mass., assignor to USM Corporation, Boston, Mass., a corporation of New Jersey Filed June 17, 1966, Ser. No. 558,474
U.S. Cl. 72—325 4 Claims
Int. Cl. B21d *31/02, 41/04;* B21j *7/16*

ABSTRACT OF THE DISCLOSURE

A machine for trimming and/or clinching the spaced leads of components mounted upon a board and having the leads extending through the board. The mechanism includes a pair of reciprocable cutting and clinching elements which are mounted for angular rotation to orient said elements in accordance with the orientation of the leads passing through the board. The mechanism also includes means for simultaneously reciprocating the cutting and clinching elements.

This invention relates to machines for securing wire terminals to work pieces. More particularly, the invention is concerned with providing a versatile lead trimming and/or clinching means of improved construction for use with electronic component inserting machines. It will be appreciated that the invention is not necessarily limited to use in component inserters and may, in fact, be applied to cut and/or clinch nonelectrical terminations. The term "lead" is accordingly herein intended in a comprehensive sense.

Large numbers of printed circuit boards are today used in the electronics industry. They are usually preformed with holes to receive the leads of various components to be electrically interconnected by the printed circuitry. The quickest and most economical means for inserting components into a printed circuit board is by an automatic machine which has been programmed to rapidly place the leads of the various components in the proper holes.

The components used in electrical fabrication are generally mass produced and are designed to be used in many situations, including original fabrication, repair and home "kit" building. Accordingly, the leads thereon are of a standard length, usually much longer than is needed when the component is used in a printed circuit board.

Because of the excessive length of leads on some of the components it is desirable to locate upon the same machine that inserts the components a device which will automatically trim and clinch the leads. Careful trimming and clinching assures proper contact between the lead and the printed circuit and removes any excess wire thus providing an accurate, reliable and neat connection.

A trimming device of the nature described is disclosed in U.S. Patent No. 3,034,382, granted May 15, 1962 to H. K. Hazel. The device of this patent does a completely adequate job of trimming and clinching the leads on the components and will work quickly and accurately as long as the components are all inserted along parallel lines. However, if any of the components are to be located perpendicular to other components or for that matter at any angle to these components, either a duplicate device must be provided at the desired angle to clinch and trim the leads or alternatively the printed circuit board must be removed from the machine, rotated and positioned by an operator over the fixed trimming and clinching device at the precise angle to enable proper operation upon said component.

An object of this invention is to provide a trimming and clinching mechanism which may be accurately and quickly rotated to any position allowing rapid fastening of components irrespective of the placement of said component with respect to the board and to other components.

A further object of this invention is to provide a trimming and clinching mechanism which is readily adjustable and operates with the same efficiency along any diameter of the circle of rotation.

The above and other objects of the invention, including various novel details of construction and combinations of parts will now be more particularly described with reference to the accompanying drawings and pointed out in the claims.

Figures 1, 2, 3:
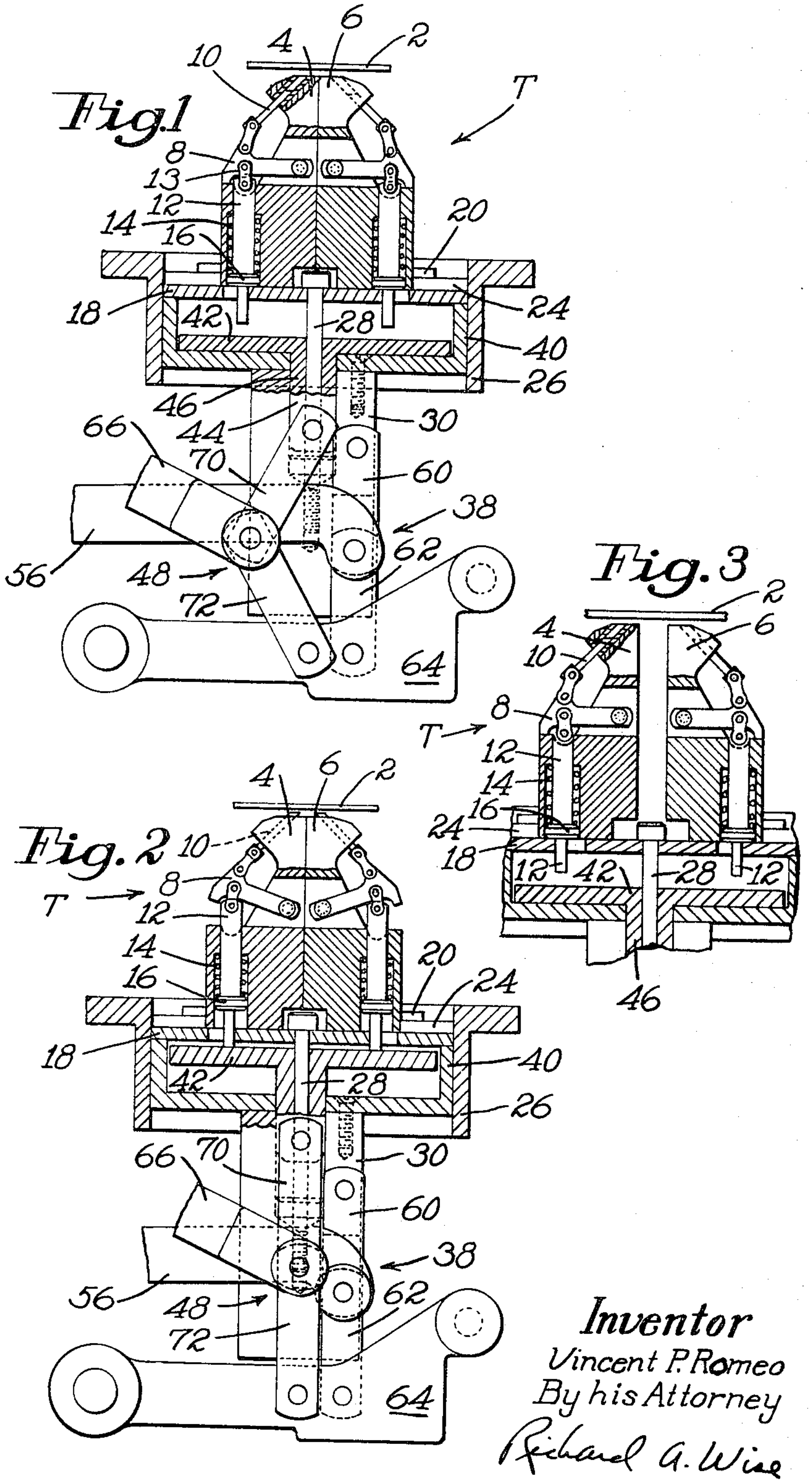
FIG. 1 is a vertical section through the trimming and clinching mechanism with the anvil carrier raised to its operative position, but with the trimming apparatus in its lowered position.
FIG. 2 is a view similar to FIG. 1 but illustrating the trimming apparatus in its raised position.
FIG. 3 is a partial view of the mechanism of FIG. 1 with the anvil halves separated for use with larger components.

Referring to FIGS. 1 and 2, there can be seen the illustrative trimming and clinching mechanism in two operating stages. Located immediately below the trimming and clinching mechanism is a portion of the operating mechanism. In operation, a board 2, such as a circuit board, having a component appropriately placed thereon with leads extending through the board, is located above the trimming and/or clinching mechanism, generally denoted T. The mechanism is raised to its operative position, the leads now lying in the path of trimming and/or clinching elements 10, the trimming and/or clinching elements are operated, trimming the leads if necessary and crimping same to the board, thus securing the component in place. If used in a completely automated machine, the sequence could well be timed so that the anvil reaches its operative position, providing support for the circuit board, simultaneously with the automatic insertion of a component. The mechanism is designed to both trim and clinch, but if the component is provided with leads of the appropriate length, it will be obvious that the device will simply clinch the lead against the board.

The trimming and clinching mechanism itself comprises an anvil consisting of two separate divisible halves 4 and 6, the use of a split anvil being for purposes to be later described. Mounted on each of said halves is the mechanism which does the actual trimming and/or clinching; this mechanism is exactly the same for both halves so only one of said mechanisms will herein be described. The trimming and/or clinching mechanism comprises a crank or offset lever 8 pivotally mounted upon the upper portion of one of said anvil halves, a trimming and/or clinching element 10 pivotally connected to said crank and movably extending into the lower portion of a bore having its upper end open through the top of said anvil half. A push rod 12 is also pivotally connected by a link 13 to said crank. The push rod 12 is movably mounted in a vertical bore, the upper end of which provides a sliding fit for the push rod and the lower portion of which is enlarged to receive a compression spring 14 surrounding the push rod. The spring 14, which urges the push rod 12 to its lowermost position, acts between the shoulder formed between the small and large portions of the bore and a shoulder 16 on the lower portion of the push rod 12. Downward movement of the push rod 12 is limited by the engagement of the shoulder 16 with a disc 18 which underlies the anvil.

In operation, upward movement is imparted to the push rod 12, compressing the spring 14 and causing the crank 8 to pivot, thus moving the trimming and clinching element 10 through the anvil half to the position as shown in FIG. 2.

Figures 4, 5, 6:
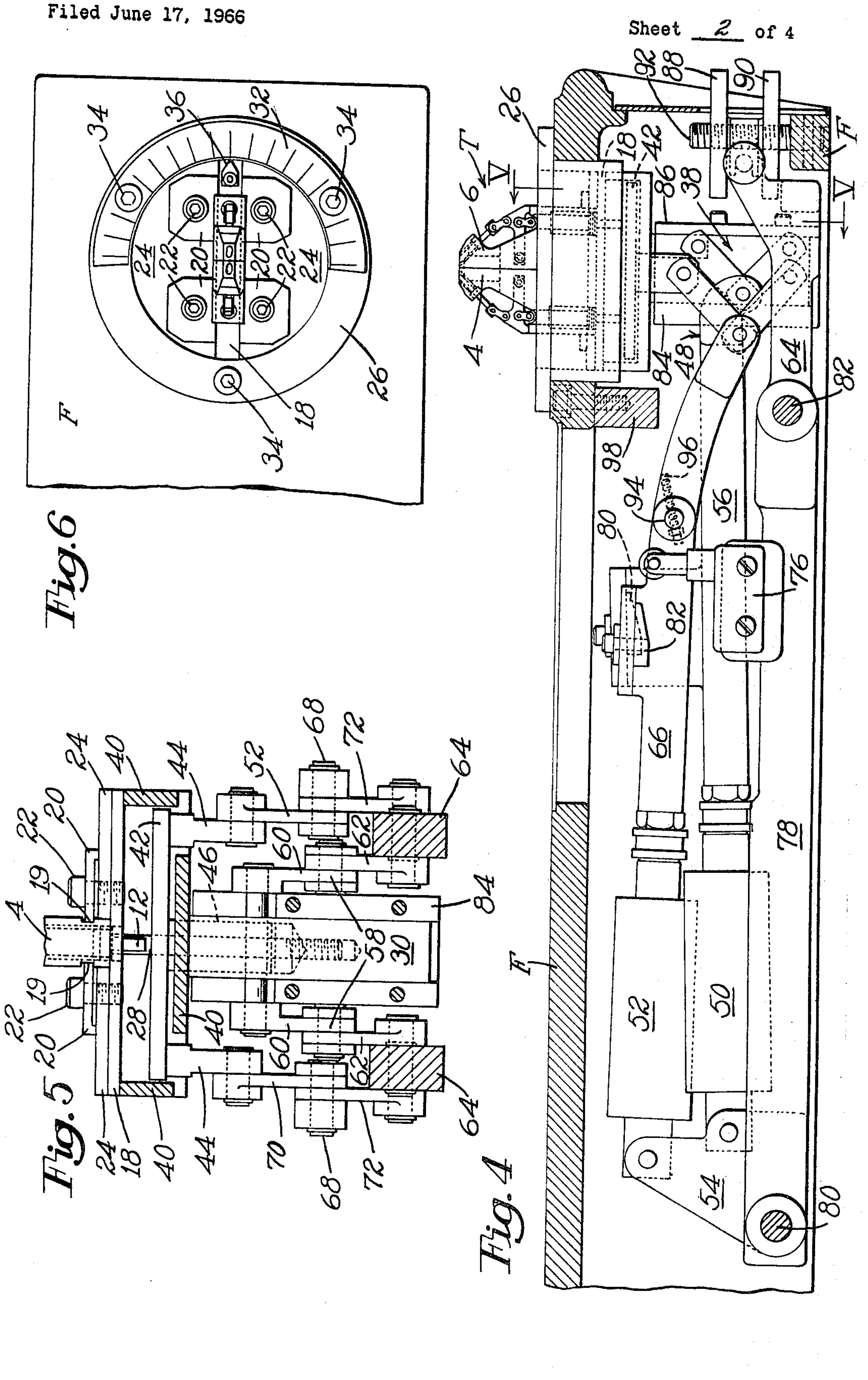
FIG. 4 is a side elevation, partly in section, of the machine.
FIG. 5 is a section along the line V—V of FIG. 4.
FIG. 6 is a plan view of the trimming and clinching mechanism including a directional scale.

The support for the anvil halves is provided by the disc 18 to which the anvil halves are adjustably fastened, see FIG. 6. For maximum versatility the anvil is designed to accommodate components of various sizes and thus having various distances between the leads. In the illustrative machine the adjustment is provided by having an anvil of two separable halves, each individually adjustable along a diameter of the supporting disc 18. The lower portion of each anvil half is provided with two horizontal, parallel grooves 19 which are also parallel to the diameter of trim, see FIG. 5. Adjacently mounted with said anvil halves and each having one edge extending into the groove of an anvil half are four clamping plates 20 (FIG. 6). The anvil halves are easily movable between the two adjacent plates when loosened, allowing adjustment of separation. When the proper separation has been determined, bolts 22, which extend through the plates 20 and into the disc 18, are tightened and clamp the anvil halves in place.

Overlying the disc 18 and adapted to assist in guiding the movement and thus maintaining proper relative orientation of the anvil halves during separation adjustment are two identical segments of a circular disc 24, through which bolts 22 extend. These disc segments are engageable with opposite sides of the anvil halves between the clamping plates 20 and the disc 18. Since these segments 24 are attached to the disc 18 it is to be understood that any movement of the disc 18 will be duplicated by the segments 24. The disc 18 and the segments 24 could well be combined into a single unitary disc having a smooth planar lower surface and a groove of the proper width and depth cut into the upper surface.

To accommodate components which are placed at various angles upon the board, the anvil with its trimming and clinching mechanism is designed to be operable in any desired angular position. In the illustrative machine the angular adjustment is provided by allowing the disc 18 and all the apparatus located thereon to be freely rotatable within a cylindrical housing 26. Once the proper angle for the trim and/or clinch has been determined, the mechanism must be locked in position to assure an acceptable product. For this purpose a bolt 28 is provided which extends through a central bore in the disc 18, through other elements later to be described, and is threaded into a non-rotatable block 30. It is to be understood that all parts through which the bolt 28 extends, with the exception of the block 30, member 40, and the disc 18 are freely movable with respect to the bolt when said bolt is tightened.

To assist in properly orienting the trimming and/or clinching mechanism, an angular scale 32 is provided upon an outwardly extending flange of the housing 26. The housing is rigidly attached to the machine frame F by means of bolts 34 and thus provides a relatively stationary reference point. Mounted upon the disc 18 along the diameter of trim and clinch is a pointer 36 to coact with scale 32 allowing an operator to rapidly orient the mechanism to the desired angle.

Thus it can be seen that given the size and orientation of a component to be trimmed and/or clinched the operator will properly angularly orient the mechanism, if necessary, by loosening bolt 28, retighten same when the mechanism T is properly positioned, adjust the separation of the anvil halves by loosening the clamping plates 20 and locking the halves in position before presenting the board for operation by tightening the plates 20. Loosening and tightening of the bolt 28 is effected by a tool inserted between the two halves of the anvil while they are in the separated position shown in FIG. 3.

The board is presented to the trimming and/or clinching mechanism by any suitable means, not critical to this invention, as for example by means of the work positioning table disclosed in U.S. Patent No. 3,143,791, issued on Aug. 11, 1964 in the name of Lanahan et al. It is to be understood that the board, when presented or simultaneous with presentation, has located thereon the components to be operated upon with their leads extending from the lower portion of the board. To assure proper clearance between the extending leads and the trimming and/or clinching mechanism it has been found desirable to have the mechanism, when inactive, rest well below the lowermost plane expected to be presented by the depending leads.

In operation, a printed circuit board 2 is placed above the trimming and clinching mechanism, after which the entire mechanism including the trimming and clinching elements 10, the anvil 4, 6, the disc 18 and all parts associated therewith is raised to an operating position beneath said board (FIG. 1). The clinching elements 10 are then linearly moved with respect to the anvil performing the trimming and/or clinching operation. The operation of trimming and clinching can be seen in FIGS. 8–11, inclusive, which sequentially show the operation of an element 10 on a component lead CL.

During the first operative step, movement of the entire mechanism into operative position, the trimming mechanism including the disc 18 and all the elements fastened thereto and located thereabove, generally denoted T, move upwardly with respect to the housing 26. The movement is effected by means of a toggle mechanism 38 acting through the rectangular block 30 and a cup-shaped member 40. The outer margin of the disc 18 rests upon the upstanding edge of the cup-shaped member 40 which is in turn rigidly fastened to the rectangular block 30. As previously noted, the bolt 28 passes through the disc 18 and is screwed into the rectangular block. When the mechanism is in operation and the bolt 28 is securely tightened, the block 30, the cup-shaped member 40 and the trimming and clinching mechanism T are rigidly connected and move as a unit.

In the actual trim and/or clinch operation, the elements 8, 10 and 12 must move relative to the anvil and so the second operative step, above described, requires separate mechanism. The moving means for the trimming and clinching elements 10 must be operative irrespective of the angular orientation of said elements and further timed to operate only when the entire mechanism is at its maximum upward position. The mechanism which enables the operation of the trimming and clinching elements, irrespective of their angular orientation, comprises a plate 42 which has a flat, circular upper surface with a pair of diametrically opposed depending legs 44 and a cylindrical dependent center portion 46 through which the bolt 28 passes.

The planar surface of element 42 spacedly underlies the lower ends of the rods 12, which extend downwardly through diametrically opposed slots in the disc 18. As the plate 42 is moved vertically upward by toggle mechanism 48, the upper surface of the plate contacts the lower extremities of the rods 12 and causes said rods to move upwardly against the pressure of the springs 14, thus causing the trimming and clinching elements 10 to move relative to the anvil as shown in FIGS. 8–11.

The reciprocal motion for both the trimming mechanism T and the trimming elements 10 is provided by a pair of air motors 50, 52 pivotally mounted to a trunnion block 54. The pistons of the air motors are each rigidly attached to an irregularly shaped arm having finger-like extensions at the end opposite that connected to the pistons. The arm 56 connected to the piston of the motor 50 has its finger-like extensions attached to the central pivot points 58 of toggles 38, FIG. 5. The upper arms 60 of the toggles 38 are pivotally attached to the rectangular block 30 whereas the lower arms 62 of said toggles are pivotally attached to a stationary base member 64. An arm 66 which is attached to the piston of the motor 52 is attached to the central pivot points 68 of toggles 48. The upper arms 70 of said toggles are connected to the depending legs 44 of element 42 and the lower arms 72 of said toggles are pivotally connected to the stationary base piece 64.

Figure 7:
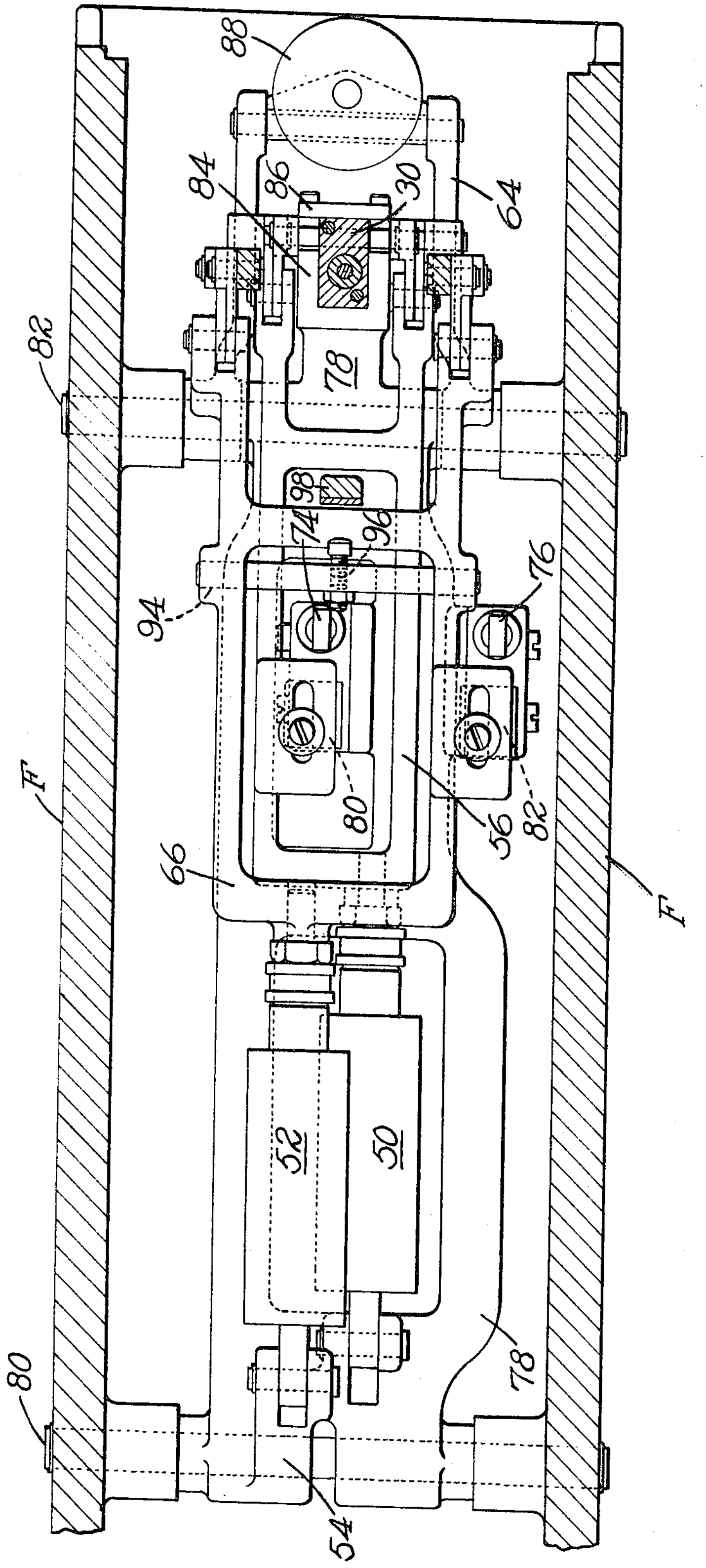
FIG. 7 is a plan view of the operating mechanism for the machine.
Figure 8:
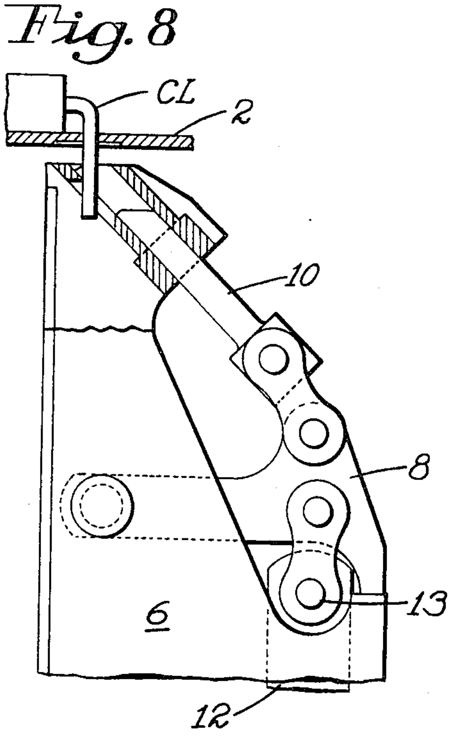
FIGS. 8–11 show one of the trimming and clinching instrumentalities in various stages of operation.
Figure 9:
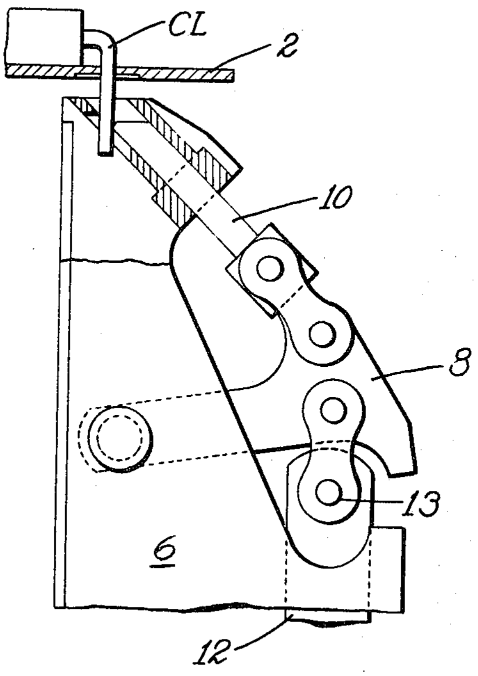
Figure 10:
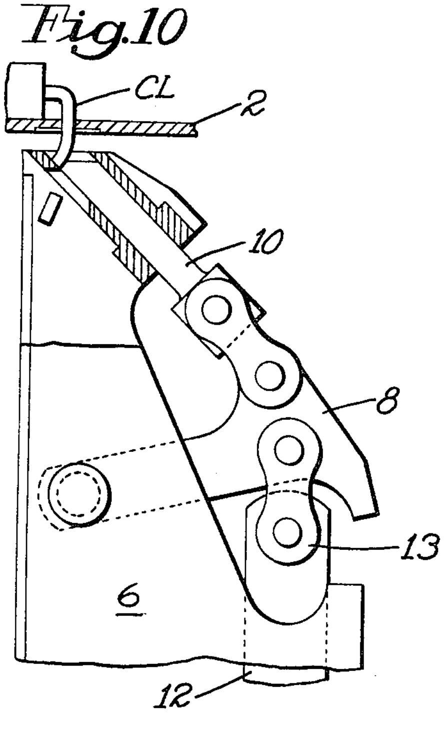
Figure 11:
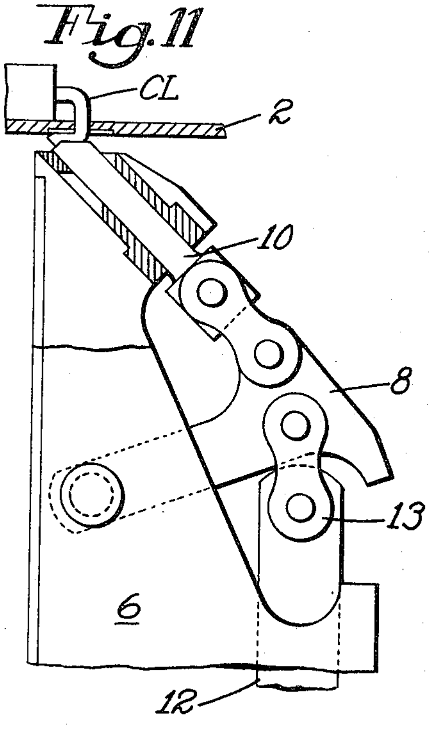

Simultaneous reference to FIGS. 4, 5 and 7 will illustrate the irregular shape of arms 56 and 66 as well as making evident the reasons therefor. Space requirements are such that the arms must at some portions have one arm overlie the other and yet where the arms are attached to the central pivot of the toggles the arms must lie in approximately the same horizontal plane. The space requirements as well as the need for a stable rigid arm member has been satisfied by making the arms of an irregular shape having a pair of relatively straight side pieces and two adjoining webs, the two arms being of different width so that the side webs of the arm 66 straddle those of the arm 56 to that at the point where they are attached to the central pivot of the trimming mechanism, they may lie in the same horizontal plane and be relatively movable without interference.

The operation of the mechanism is started by the introduction of air under pressure into the air motor 50 which imparts a horizontal motion to the arm 56, straightening the arms of the toggles 38, thus raising the trimming mechanism T to its operative position. When the mechanism T is in its operative position the air motor 52 imparts motion to the rigid arm 66 straightening the arms of the toggles 48 thus elevating the plate 42 and the push rods 12 to operate the trimming and/or clinching elements 10.

Sequential operation of the motors to move the arms 56 and 66 sequentially first to elevate the trimming mechanism T and then to operate the trimming elements 10 is controlled by a pair of upstanding switches 74 and 76, rigidly mounted upon a base member 78. Adjustably mounted upon the irregular arms 56 and 66 are cam members 80 and 82, respectively, and appropriately placed so that when the associated arm reaches its maximum extended position, the underlying switch mechanism will be tripped. The arms are designed to reach their maximum horizontal movement at the time when the arms of the respective toggle mechanisms are colinear.

In operation when a circuit board with depending leads is appropriately placed above the trimming and/or clinching mechanism, the operator admits air to the motor 50 which as stated above raises the trimming mechanism T to the operative position. When the trimming mechanism T reaches its operative position the cam member 80 mounted on the arm 56 actuates the switching mechanism 74 which in turn controls admission of air to the motor 52, moving the arm 66 forward, thus moving the arms of the toggles 48 to their colinear positions performing the trimming step as described above. When the arms of the toggles 48 reach colinear positions the cam member 82, adjustably mounted thereon, actuates the switch 76 which exhausts both of the air motors allowing the entire mechanism to return to its inoperative position. The circuitry by which the switches control the mechanism forms no part of the present invention and is not illustrated herein.

Referring now to FIGS. 4 and 7, it will be noted that the base member 78 is rigidly mounted within the frame by means of a pair of rods 80 and 82. This base member provides stable support for the trunnion block 54, the switch mechanisms 74 and 76 and extends to a point generally beneath the trimming mechanism T where it has a bifurcated portion 84 which, when closed by a plate

86, forms a rectangular slide for the block 30. Pivotally mounted on the rod 82 is the U-shaped base member 64 which underlies the toggles 38 and 48. The exterior ends of the legs of the U-shaped member 64 are pivotally mounted upon the rod 82 whereas the joining portion of said base member extends between two discs 88, 90 which are adjustably mounted upon a threaded rod 92.

Since the circuit board upon which elements will be trimmed and clinched may vary in thickness and since, through operation, the means for holding the circuit board above the trimming and clinching mechanism may change in position, adjustment may be necessary to assure a proper trim and clinch. This adjustment is provided by mounting the toggles 38 and 48 upon the base member 64 which when adjusted by the discs 88, 90 acts as a lever to raise and lower the entire trimming mechanism T. To prevent the toggles 48 from overthrowing, a rod 94 joining the two exterior portions of the arm 66 supports an adjustable stop screw 96 passing through the rod 94 and positioned to abut a depending portion 98 of the frame when the toggles are in straightened positions.

It will be understood that the particular machine embodying the invention is shown by way of illustration only and not as a limitation of the invention. The principles and features of this invention may be employed in varied and numerous embodiments without departing from the scope of the invention.

Having thus described my invention, what I claim as new and desire to secure by Letters Patent of the United States is:

1. A machine for trimming and/or clinching the spaced leads of components extending through a board disposed in a predetermined plane comprising a pair of opposed coplanar cutting and clinching mechanisms, each of which includes a reciprocable cutting and clinching element, a support for said mechanisms, means mounting said support for angular adjustment of the coplanar cut and clinch mechanisms about an axis normal to the plane of the board to orient said mechanisms in accordance with the orientation of the leads passing through the board, and means operable independently of the adjusted position of said mechanisms for simultaneously reciprocating the cutting and clinching elements.

2. A machine as defined in claim 1, wherein means are provided for mounting said mechanisms for adjustment toward and from each other to accommodate variations in the spacing of the leads to be operated upon.

3. A machine as defined in claim 1, in which means are provided for moving the mechanisms as a unit toward and away from the work to be operated upon.

4. A machine as defined in claim 2, in which the means for reciprocating the cutting and clinching elements includes push rods operatively connected thereto, and a plate engageable with an end of each of said push rods and movable axially thereof.

References Cited

UNITED STATES PATENTS

| | | | |
|---|---|---|---|
| 2,893,010 | 7/1959 | Stuhre | 29—203 |
| 2,902,689 | 9/1959 | Petersen | 29—203 |
| 2,907,040 | 10/1959 | Woods | 29—203 |
| 2,958,869 | 11/1960 | Drukker et al. | 29—203 |
| 2,978,707 | 4/1961 | Runciman | 29—203 |
| 3,034,382 | 5/1962 | Hazel | 29—566 |

FOREIGN PATENTS

| | | |
|---|---|---|
| 808,029 | 1/1959 | Great Britain. |

CHARLES W. LANHAM, *Primary Examiner.*

E. M. COMBS, *Assistant Examiner.*

U.S. Cl. X.R.

29—203; 72—400